United States Patent
Park et al.

(10) Patent No.: US 12,471,483 B2
(45) Date of Patent: Nov. 11, 2025

(54) DISPLAY DEVICE INCLUDING PROTECTION LAYER GROOVES AND SUPPORT MEMBER OPENINGS

(71) Applicant: SAMSUNG DISPLAY CO., LTD., Yongin-si (KR)

(72) Inventors: Ju-Young Park, Cheonan-si (KR); Ju Yeop Seong, Suwon-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 632 days.

(21) Appl. No.: 17/887,684

(22) Filed: Aug. 15, 2022

(65) Prior Publication Data
US 2023/0200114 A1    Jun. 22, 2023

(30) Foreign Application Priority Data
Dec. 21, 2021  (KR) .......................... 10-2021-0183946

(51) Int. Cl.
*H10K 50/84*    (2023.01)
*H05K 1/18*     (2006.01)
*H10K 50/844*   (2023.01)
*H10K 77/10*    (2023.01)
*H10K 102/00*   (2023.01)

(52) U.S. Cl.
CPC .......... *H10K 50/844* (2023.02); *H05K 1/189* (2013.01); *H05K 2201/10128* (2013.01); *H10K 77/10* (2023.02); *H10K 2102/311* (2023.02)

(58) Field of Classification Search
CPC .............. H10K 50/844; H10K 50/841; H10K 59/873; H10K 77/10; H10K 77/111; G09F 9/301; H05K 1/189; H05K 1/028
See application file for complete search history.

(56) References Cited

U.S. PATENT DOCUMENTS

| 12,166,912 | B2 * | 12/2024 | Shin | H04M 1/0268 |
| 2013/0148312 | A1 * | 6/2013 | Han | H05K 1/028 361/736 |
| 2016/0218305 | A1 * | 7/2016 | Kim | H10K 59/124 |
| 2019/0101785 | A1 * | 4/2019 | Araki | G02F 1/133512 |
| 2020/0006397 | A1 * | 1/2020 | Park | H10D 86/443 |

(Continued)

FOREIGN PATENT DOCUMENTS

| KR | 10-2018-0032742 | 4/2018 |
| KR | 10-2018-0051701 | 5/2018 |

(Continued)

*Primary Examiner* — Ida M Soward
(74) *Attorney, Agent, or Firm* — F. CHAU & ASSOCIATES, LLC

(57) ABSTRACT

A display device having a display panel including first to third regions. The second region and the third region are respectively connected to opposite sides of the first region. The third region is bendable. A flexible circuit board is connected to an end of the third region. A first protection layer overlaps the first region to third regions. A second protection layer overlaps at least a portion of the third region. A support member overlaps the first protection layer. The support member includes a plurality of openings. The first protection layer includes a first groove overlapping at least a portion of the second region and a second groove overlapping at least a portion of the third region. Each of the first groove and the second groove overlaps the support member.

20 Claims, 7 Drawing Sheets

(56) References Cited

U.S. PATENT DOCUMENTS

| | | | | |
|---|---|---|---|---|
| 2020/0105168 A1* | 4/2020 | Choi | ................... | H10K 59/8731 |
| 2020/0136066 A1* | 4/2020 | Jin | ....................... | H10K 59/131 |
| 2020/0203459 A1* | 6/2020 | Wang | ................... | H10K 77/111 |
| 2021/0365132 A1* | 11/2021 | Jung | ................... | G06F 3/04164 |
| 2021/0407344 A1* | 12/2021 | Lee | ...................... | H10K 59/131 |

FOREIGN PATENT DOCUMENTS

| | | |
|---|---|---|
| KR | 10-2111726 | 5/2020 |
| KR | 10-2203910 | 1/2021 |

\* cited by examiner

DISPLAY DEVICE INCLUDING PROTECTION LAYER GROOVES AND SUPPORT MEMBER OPENINGS

CROSS-REFERENCE TO RELATED APPLICATION

This application claims priority under 35 U.S.C. § 119 to Korean Patent Application No. 10-2021-0183946, filed on Dec. 21, 2021 in the Korean Intellectual Property Office, the disclosure of which is incorporated by reference in its entirety herein.

1. TECHNICAL FIELD

The present disclosure relates to a display device.

2. DISCUSSION OF RELATED ART

There are various types of display devices, such as a liquid crystal display (LCD), a plasma display panel (PDP), an organic light emitting diode device (OLED device), a field emission display (FED), and an electrophoretic display device.

A foldable display device that can be folded or unfolded, a reliable display device that can be rolled up, and a slidable display device that can expand or reduce a display area have recently been developed for increased user convenience.

SUMMARY

Embodiments of the present disclosure provide a display device capable of reducing a compressive stress of a protection layer to prevent damage to signal wires. In addition, embodiments of the present disclosure provide a display device in which a display panel is easily bendable by reducing the compressive stress of the protection layer.

According to an embodiment of the present disclosure, a display device has a display panel including first to third regions. The second region and the third region are respectively connected to opposite sides of the first region. The third region is bendable. A flexible circuit board is connected to an end of the third region. A first protection layer overlaps the first region to third regions. A second protection layer overlaps at least a portion of the third region. A support member overlaps the first protection layer. The support member includes a plurality of openings. The first protection layer includes a first groove overlapping at least a portion of the second region and a second groove overlapping at least a portion of the third region. Each of the first groove and the second groove overlaps the support member.

In an embodiment, the second region of the display panel may be a rollable or slidable region.

In an embodiment, the third region may include a bending region, and the third region may be in a bent state so that at least a portion of the third region is positioned on a rear surface of the display panel.

In an embodiment, the second protection layer may include at least one or more third grooves.

In an embodiment, the plurality of openings included in the support member may include a first opening overlapping at least a portion of the first groove, and a second opening overlaps at least a portion of the second groove.

In an embodiment, the third groove may overlap at least a portion of the second opening.

In an embodiment, a cross-section of each of the first to third grooves may have a shape in which a width thereof becomes narrower in a direction towards the display panel.

In an embodiment, a height of each of the first to third grooves may be in a range of about 30 µm to about 90 µm.

In an embodiment, the plurality of openings included in the support member may include a plurality of first openings overlapping the second region and a plurality of second openings overlapping the third region, the first groove may overlap at least two first openings, and the second groove may overlap at least two second openings.

In an embodiment, the second protection layer may include a third groove overlapping at least two second openings.

In an embodiment, a width of the first groove may be greater than a width of the plurality of first openings, and widths of the second groove and the third groove may be greater than a width of the plurality of second openings.

In an embodiment, the display device may further include: a first auxiliary member overlapping the first groove; a second auxiliary member overlapping the second groove; and a third auxiliary member overlapping the third groove.

In an embodiment, the display device further include a barrier layer positioned between the third region of the display panel and the support member, the first auxiliary member may be integrally for ted with the barrier layer, and the second auxiliary member may be integrally formed with the support member.

In an embodiment, the display device may further include an adhesive layer positioned between the support member and the second region of the display panel, and the third auxiliary member may be integrally formed with the adhesive layer.

According to an embodiment of the present disclosure, a display device has a display panel including a display area and a non-display area. A flexible circuit board is connected to an end of the non-display. A first protection layer overlaps the display area and at least a portion of the non-display area. A second protection layer overlaps at least a portion of the non-display area. A first support member and a second support member overlap the first protection layer. The first and second support members include a plurality of openings. The first protection layer includes a first groove overlapping the first support member and a second groove overlapping the second support member.

In an embodiment, the display area may include a first area and a second area overlapping the first support member, and the non-display area includes a third area overlapping the second support member.

In an embodiment, the second protection layer may include a third groove overlapping the third area.

In an embodiment, a width of each of the first groove to the third groove may decrease in a direction towards the display panel in a cross-sectional view.

In an embodiment, the first support member may include a plurality of first openings, the second support member may include a plurality of second openings, the first groove may overlap at least one first opening, and the second groove may overlap at least one second opening.

In an embodiment, the first groove and the at least one first opening may have a same shape in a plan view.

According to embodiments of the present disclosure, it is possible to provide a display device capable of reducing a compressive stress of a protection layer to prevent damage to signal wires. In addition, according to the embodiments, it is possible to provide a display device in which a display panel is easily bendable by reducing the compressive stress of the protection layer.

DETAILED DESCRIPTION OF EMBODIMENTS

Figure 1:
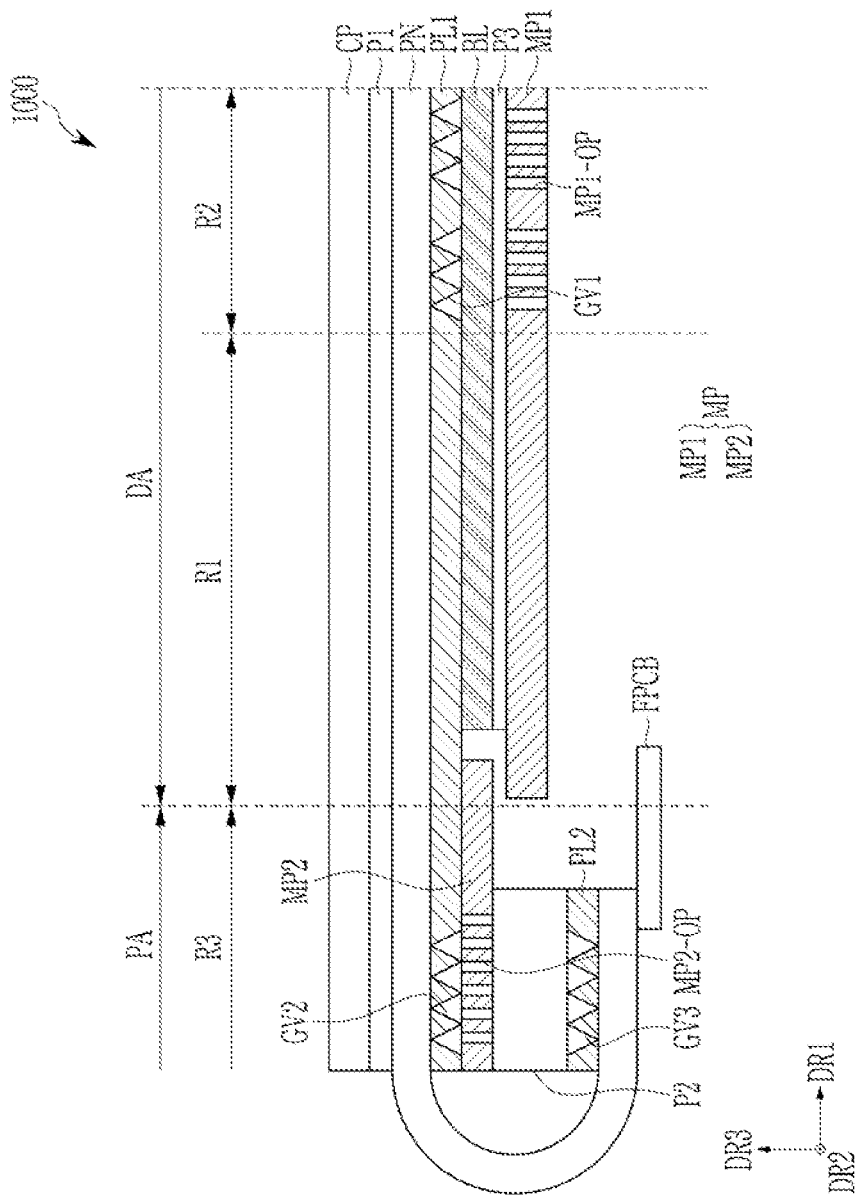
FIG. 1 illustrates a schematic cross-sectional view of a display device according to an embodiment of the present disclosure.

The present disclosure will be described more fully hereinafter with reference to the accompanying drawings, in which embodiments of the present disclosure are shown. As those skilled in the art would realize, the described embodiments may be modified in various different ways, all without departing from the spirit or scope of the present disclosure.

To clearly describe the present invention, pans that are irrelevant to the description are omitted, and like numerals refer to like or similar constituent elements throughout the specification.

Further, since sizes and thicknesses of constituent members shown in the accompanying drawings may be arbitrarily given for better understanding and ease of description, the present invention may not necessarily be limited to the illustrated sizes and thicknesses. In the drawings, the thicknesses of layers, films, panels, regions, etc., may be exaggerated for clarity. In the drawings, for better understanding and ease of description, the thicknesses of some layers and areas are exaggerated.

It will be understood that when an element such as a layer, film, region, or substrate is referred to as being "on" another element, it can be directly on the other element or intervening elements may also be present. In contrast, when an element is referred to as being "directly on" another element, there are no intervening elements present. Further, in the specification, the word "on" or "above" means positioned on or below the object portion, and does not necessarily mean positioned on the upper side of the object portion based on a gravitational direction.

In addition, unless explicitly described to the contrary, the word "comprise" and variations such as "comprises" or "comprising" will be understood to imply the inclusion of stated elements but not the exclusion of any other elements.

Further, in the specification, the phrase "in a plan view" means when an object portion is viewed from above, and the phrase "in a cross-sectional view" means when a cross-section taken by vertically cutting an object portion is viewed from the side.

Hereinafter, a display device according to an embodiment will be described with reference to FIG. 1 and FIG. 2. FIG. 1 illustrates a schematic cross-sectional view of a display device according to an embodiment, and FIG. 2 illustrates a perspective view showing a partial area of the display device according to the embodiment of FIG. 1.

Figure 2:
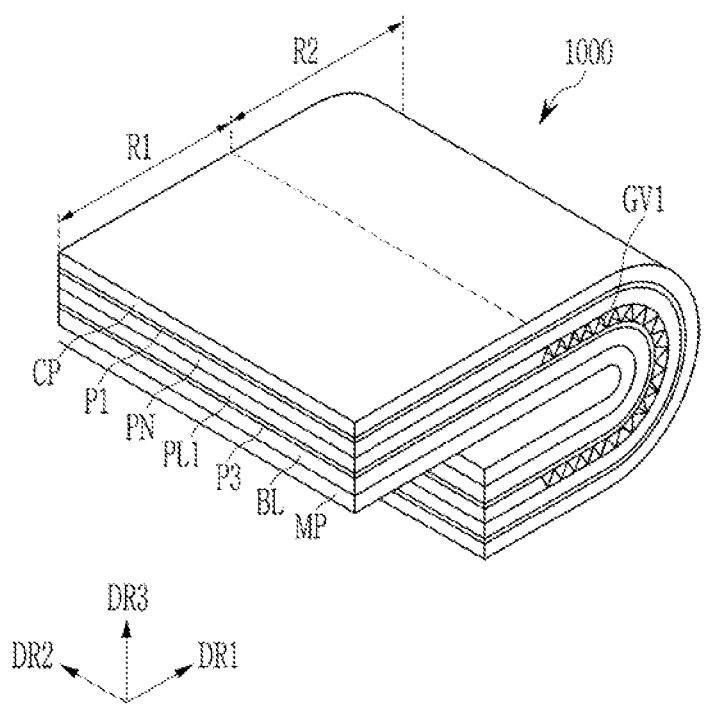
FIG. 2 illustrates a perspective view showing a partial area of the display device of FIG. 1 according to an embodiment of the present disclosure.

Referring to FIG. 1 and FIG. 2, the display device 1000 according to an embodiment includes a display panel PN for displaying an image by including a plurality of pixels, a cover window CP positioned on the display panel PN, and a support member MP positioned under the display panel PN (e.g., in a third direction DR3) to support the display panel PN.

In an embodiment, the cover window CP may include a window made of glass or a window including a polymer resin. In an embodiment, a window protection member may be positioned on an upper surface of the window including glass or polymer resin. The window protection member may protect the window from external impact and may prevent or reduce scratches on the upper surface of the window. In an embodiment, the window protection member may include a polymer resin. However, embodiments of the present disclosure are not necessarily limited thereto, and the window protection member may include an inorganic material.

A first adhesive layer P1 may be positioned between the display panel PN and the cover window CP (e.g., in the third direction DR3).

The display panel PN according to an embodiment may include a display area DA and a non-display area PA. The display area DA may be an area in which a pixel operates depending on an electrical signal to emit light for generating an image. The non-display area PA may be an area surrounding the display area DA and may not include pixels. The non-display area PA is an area in which an image is not displayed. Shapes of the display area DA and the non-display area PA may be relatively designed and are not necessarily limited to those shown in the Figures.

In the display panel PN, a first surface on which an image is displayed is parallel to a surface defined by a first direction DR1 and a second direction DR2. A direction normal to a surface on which an image is displayed, i.e., a thickness direction of the display panel PN, is represented as the third direction DR3. A front (i.e., a top) surface and a back (i.e., a bottom) surface of each of the members are separated in the third direction DR3. However, directions indicated by the first to third directions DR1, DR2, and DR3 may be converted to other directions as a relative concept. Additionally, although the first to third directions DR1, DR2, and DR3 are shown to be orthogonal to each other, the first to third directions DR1, DR2, and DR3 may cross each other at various different angles.

The display area DA includes a plurality of pixels. The pixels may be positioned in the display area DA. Each of the pixels may include an organic light emitting diode and a pixel driving circuit connected thereto.

In an embodiment, each of the pixels emits red, green, blue, or white light, and may include an organic light emitting diode. However embodiments of the present disclosure are not necessarily limited thereto. The display panel PN provides a predetermined image through light emitted from the pixels, and the display area DA is defined by the pixels. In the present specification, the non-display area PA is an area in which pixels are not positioned and indicates an area in which an image is not provided.

The display panel PN may include a first region R1, a second region R2, and a third region R3. In an embodiment, the first region R1 may be a flat display area DA, and the second region R2 may be a curved display area DA connected to the first region R1 (e.g., in the first direction DR1). The second region R2 may be a rollable area or a slidable area as illustrated in FIG. 2. The third region R3 may be a non-display area PA. The third, region R3 may extend from the first region R1 to be bent. The third region R3 may include a bending region, and a bent end of the third region R3 may overlap the display panel PN (e.g., in the third direction DR3). The on-display area PA seen on a front surface of the display device 1000 may be reduced by the third area R3. As illustrated in FIG. 1, in an embodiment the third region R3 may be bent to be positioned on a rear surface of the display panel PN, and then assembled.

A flexible circuit board FPCB may be electrically connected to an end of the display panel PN, in particular, a first end of the non-display area PA. In an embodiment, the flexible circuit board FPCB may transfer a signal or power of an IC driving chip to the display panel PN.

The display panel PN may be formed as an organic light emitting panel. However, a type of the display panel PN is not necessarily limited thereto, and it may be formed as various types of panels. For example, the display panel PN may be formed as a liquid crystal display panel, an electrophoretic display panel, an electrowetting display panel, or the like. In addition, the display panel PN may be formed as a next-generation display panel such as a micro light emitting diode display panel, a quantum dot light emitting diode display panel, or a quantum dot organic light emitting, diode display panel.

The micro LED display panel is formed in such a way that a light emitting diode having a size in a range of about 10 to about 100 µm constitutes each pixel. Such a micro light emitting diode display panel may use an inorganic material, may omit a backlight, may have a fast reaction speed, may implement high luminance with low power, and may not be broken when bent. A quantum dot light emitting diode display panel is formed by attaching a film containing quantum dots or using a material containing quantum dots. Quantum dots refer to particles made of an inorganic material such as indium or cadmium, emitting light by themselves, and having a diameter of about several nanometers or less. Light of a desired color may be displayed by controlling a particle size of the quantum dots. The quantum dot organic light emitting diode display panel is formed by a method of realizing color by using a blue organic light emitting diode as a light source and attaching a film containing red and green quantum dots thereon, or depositing a material containing, red and green quantum dots. The display panel PN according to an embodiment may be formed as various other display panels.

The support member MP may be positioned on the rear surface of the display panel PN. The support member MP may support the display panel PN. In an embodiment, the support member MP may include a metal or reinforced plastic capable of blocking light. However, embodiments of the present disclosure are not necessarily limited thereto.

The support member MP may include a first support member MP1 and a second support member MP2. The first support member MP1 may overlap the first region R1 and the second region R2, and the second support member MP2 may overlap the third region R3.

Although the present specification has illustrated and described an embodiment in which the support member MP includes the first support member MP1 and the second support member MP2, embodiments of the present disclosure are not necessarily limited thereto, and the support member MP may include a support member in which the first support member and the second support member are integrally formed, or may include support members divided into two or more thereof.

The first support member MP1 may include a plurality of first openings MP1-OP overlapping the second region R2. The first support member MP1 may include the plurality of first openings MP1-OP overlapping the second region R2 to facilitate bending of the display panel PN in the second region R2.

The second support member MP2 may include a plurality of second openings MP2-OP overlapping the third region R3. The second support member MP2 may include the plurality of second openings MP2-OP overlapping the third region R3 to facilitate bending of the display panel PN in the third region R3.

A first protection layer PL1 may be positioned between the display panel PN and the first support member MP1 (e.g., in the third direction DR3). In an embodiment, the first protection layer PL1 may overlap each of the first to third regions R1 to R3. In addition, a portion of the first protection layer PL1 or the second protection layer PL2 may be positioned between the display panel PN and the second support member MP2 (e.g., in the third direction DR3).

The first protection layer PL1 and the second protection layer PL2 way be disposed under the display panel PN to support the display panel PN and protect the display panel PN from external impact. In an embodiment, each of the first protection layer PL1 and the second protection layer PL2 may be formed of a polymer resin such as polyethylene terephthalate or polyimide.

The first protection layer PL1 and the second protection layer PL2 may be positioned on the rear surface of the display panel PN (i.e., disposed directly thereon). In an embodiment, the second protection layer PL2 may overlap an end of the third region R3. The second protection layer PL2 positioned at the end of the bent third region R3 may overlap the second support member MP2 and a portion of the first protection layer PL1. The second protection layer PL2 may also be coupled to a second adhesive layer P2 disposed on the rear surface of the second support member MP2. In addition, in an embodiment, the first protection layer PL1 and the second protection layer PL2 may be attached to the rear surface of the display panel PN through an adhesive layer.

In an embodiment, the first protection layer PL1 may include a first groove GV1 overlapping the second region R2 and a second groove GV2 overlapping the third region R3. In addition, the second protection layer PL2 may include a third groove GV3 overlapping the third region R3.

Each of the first groove GV1 the second groove GV2, and the third groove GV3 may have various shapes. For example, in an embodiment, the first groove GV1, the second groove GV2, and the third groove GV3 may have a shape that becomes narrower in a direction towards the display panel PN. However, embodiments of the present disclosure are not necessarily limited thereto. Each of the first groove GV1, the second groove GV2 and the third groove GV3 may have various heights. For example, in an embodiment the heights of the first groove GV1, the second groove GV2, and the third groove GV3 may be in a range of about 30 µm to about 90 µm.

The first groove GV1, the second groove GV2, and the third groove GV3 may at least partially overlap an opening included in the support member MP (e.g. in the third direction DR3). The first groove GV1 may overlap the first opening MP1-OP included in the first support member MP1. In an embodiment, each first groove GV1 may overlap each first opening MP1-OP. However, embodiments of the present disclosure are not necessarily limited thereto, and the first groove GV1 may overlap at least a portion of the first opening MP1-OP. For example, the first groove GV1 may overlap at least two first openings MP1-OP. The second groove GV2 may overlap the second opening MP2-OP included in the second support member MP2. For example, the second groove GV2 may overlap at least two second openings MP2-OP. In an embodiment, each second groove CV2 may overlap each second opening MP2-OP. However, embodiments of the present disclosure are not necessarily limited thereto. For example, in an embodiment the second groove GV2 may overlap at least a portion of the second opening MP2-OP. The third groove GV3 may overlap the second opening MP2-OP included in the second support member MP2. For example, the third groove GV3 may overlap at least two second openings MP2-OP. In an embodiment, each third groove GV3 may overlap each second opening MP2-OP. However, embodiments of the present disclosure are not necessarily limited thereto, and the third groove GV3 may be formed to overlap at least a portion of the second opening MP2-OP. The second groove GV2 and the third groove GV3 may overlap each other e.g., in the third direction DR3).

A barrier layer BL may be positioned between the first protection layer PL1 and the first support member MP1 (e.g., in the third direction DR3). The barrier layer BL may be disposed under the first protection layer PL1. The barrier layer BL may be positioned under the display panel PN to support the display panel PN. In an embodiment, the barrier layer BL may be made of a polymer resin such as polyethylene terephthalate or polyimide. A third adhesive layer P3 may be positioned between the barrier layer BL and the first support member MP1.

In the display device according to an embodiment, the protection layers PL1 and PL2 positioned on the rear surface of the display panel PN may include a plurality of grooves. A compressive stress applied to the protection layer and the display panel may be reduced by the grooves.

Figure 3:
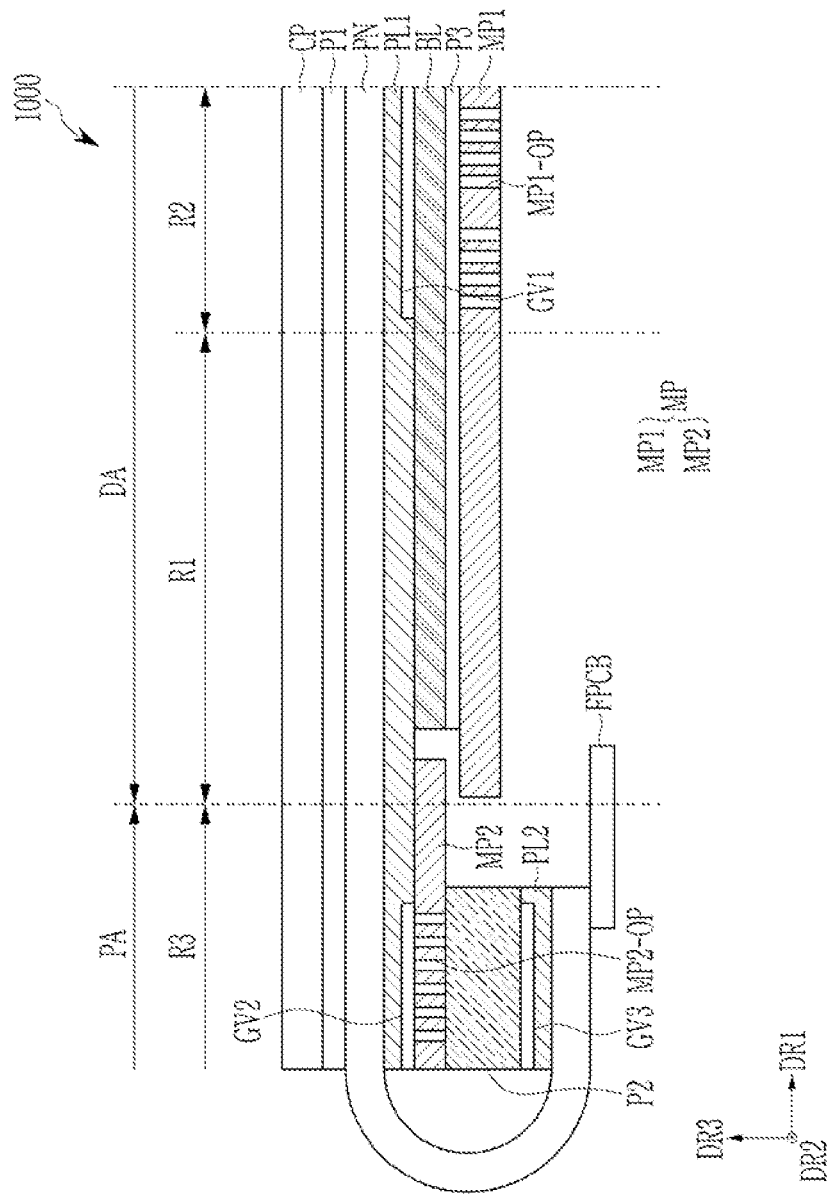
FIG. 3 illustrates a schematic cross-sectional view of a display device according to an embodiment of the present disclosure.
Figure 4:
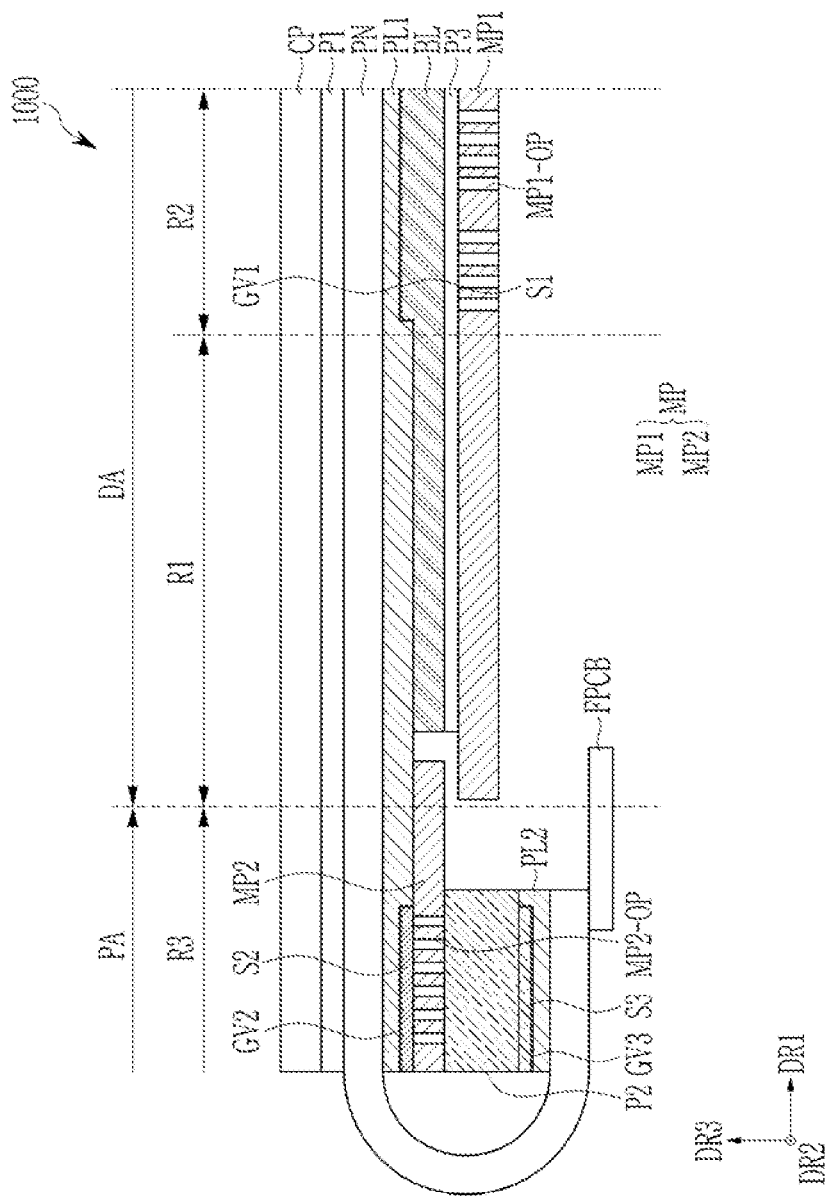
FIG. 4 illustrates a schematic cross-sectional view of a display device according to an embodiment of the present disclosure.
Figure 5:
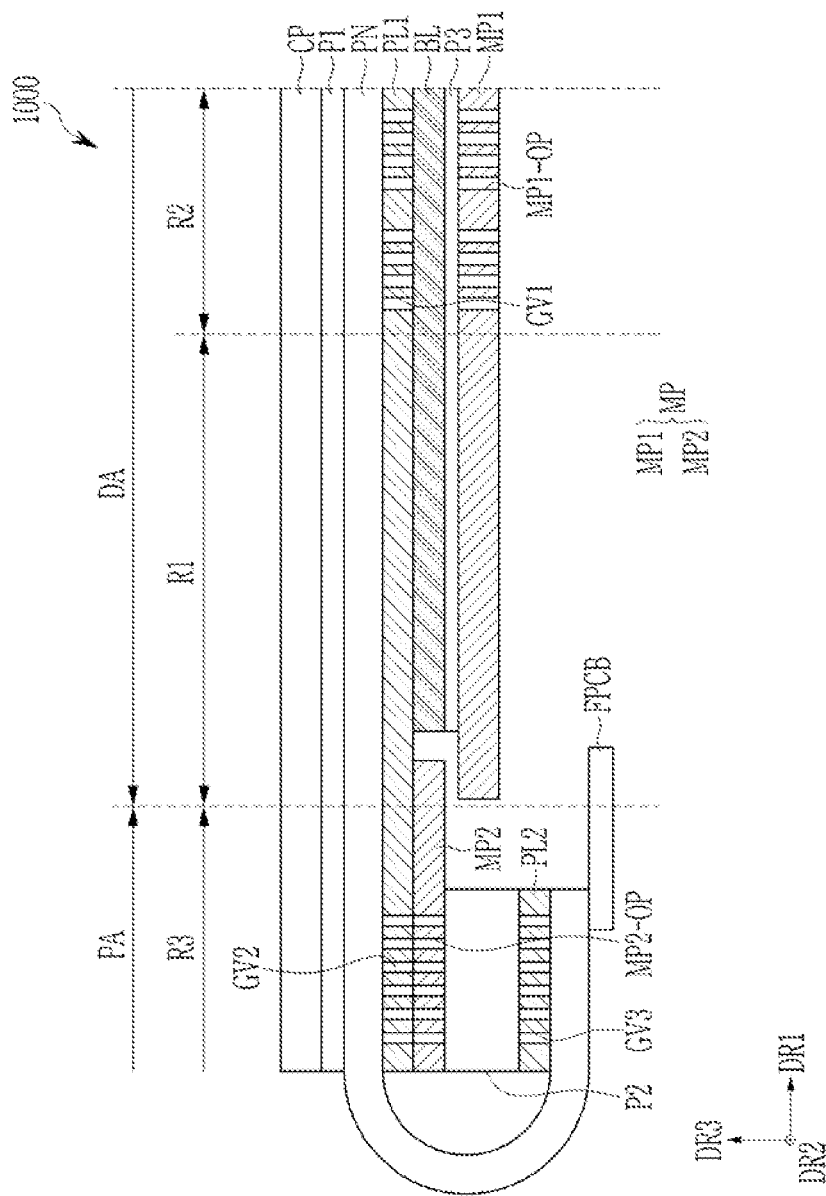
FIG. 5 illustrates a schematic cross-sectional view of a display device according to an embodiment of the present disclosure.
Figure 6:
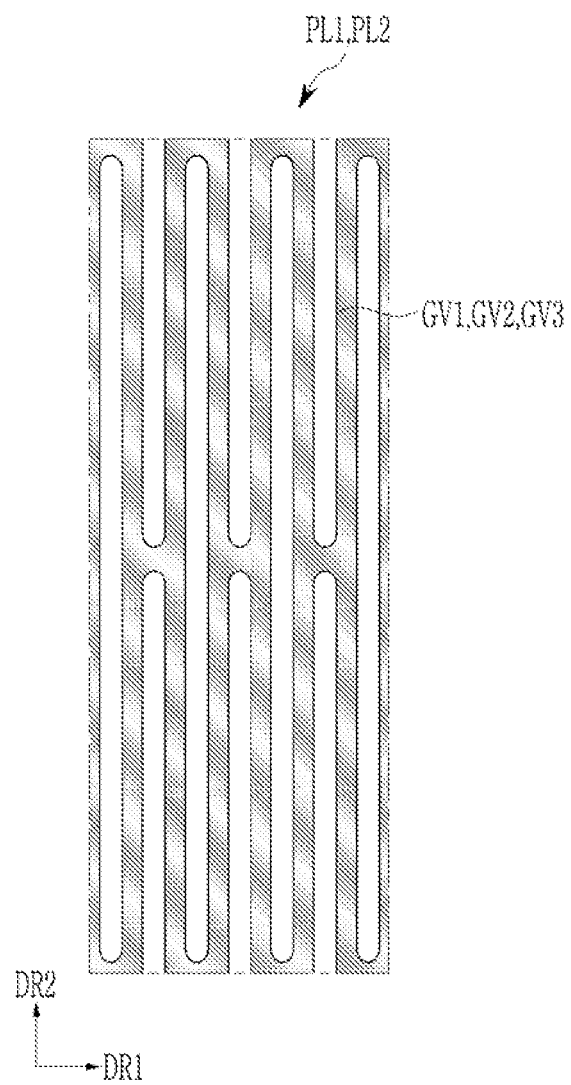
FIG. 6 illustrates a top plan view of a protection layer of FIG. 5 according to an embodiment of the present disclosure.

Hereinafter, a display device according to embodiments of the present disclosure will be described with reference to FIG. 3 to FIG. 6. FIG. 3 to FIG. 5 each illustrate a schematic cross-sectional view of a display device according to embodiments of the present disclosure, and FIG. 6 illustrates a top plan view of a protection layer shown in FIG. 5 according to an embodiment. A description of the same or similar constituent elements as those described above may be omitted for convenience of explanation.

Referring to FIG. 3, the display device 1000 according to an embodiment includes a display panel PN for displaying an image by including a plurality of pixels, a cover window CP positioned on the display panel PN, and a support member MP positioned under the display panel PN to support the display panel PN. In addition, the display device 1000 according to an embodiment may include a first adhesive layer P1 positioned between the cover window CP and the display panel PN, a second adhesive layer P2 positioned between the second support member MP2 and the second protection layer PL2, and a third adhesive layer P3 positioned between the barrier layer BL and the first support member MP1.

The display panel PN according to an embodiment may include a display area DA and a non-display area PA. In addition, the display panel PN may include a first region R1, a second region R2, and a third region R3. The first region R1 may be a flat display area DA, and the second region R2 may be a curved display area DA connected to the first region R1. The second region R2 may be a rollable or slidable region. The third region R3 may be a non-display area PA. The third region R3 may extend from the first region R1 (e.g., in the first direction DR1) to be bent. The third region R3 may include a bending region, and a bent end of the third region R3 may overlap a rear surface of the display panel PN (e.g., in the third direction DR3).

The support member MP may be positioned on the rear surface of the display panel PN. In an embodiment, the support member MP may support the display panel PN and may include a metal or reinforced plastic capable of blocking light.

The support member MP may include a first support member MP1 and a second support member MP2. The first support member MP1 may overlap the first region R1 and the second region R2, and the second support member MP2 may overlap the third region R3.

The first support member MP1 may include a plurality of first openings MP1-OP overlapping the second region R2. The first support member MP1 may include the plurality of first openings MP1-OP overlapping the second region R2 to facilitate bending of the display panel PN in the second region R2.

The second support member MP2 may include a plurality of second openings MP2-OP overlapping the third region R3. The second support member MP2 may include the plurality of second openings MP2-OP overlapping the third region R3 to facilitate bending of the display panel PN in the third region R3.

A first protection layer PL1 may be positioned between the display panel PN and the first support member MP1 (e.g., in the third direction DR3). In addition, a portion of the first protection layer PL1 or the second protection layer PL2 may be positioned between the display panel PN and the second support member MP2 (e.g., in the third direction DR3).

The first protection layer PL1 and the second protection layer PL2 are disposed on the rear surface of the display panel PN to support the display panel PN and to protect the display panel PN from external impact. In an embodiment, the first protection layer PL1 and the second protection layer PL2 may each be formed of a polymer resin such as polyethylene terephthalate or polyimide.

The first protection layer PL1 and the second protection layer PL2 may be positioned on the rear surface of the display panel PN. The second protection layer may overlap an end of the third region R3. The second protection layer PL2 positioned at the end of the bent third region R3 may overlap the second support member MP2 and a portion of the first protection layer PL1.

The first protection layer PL1 may include a first groove GV1 overlapping the second region R2, and a second groove GV2 overlapping the third region R3. In addition, the second protection layer PL2 may include a third groove GV3 overlapping the third region R3.

Each of the first groove GV1 the second groove GV2, and the third groove GV3 may have various shapes and, for example, may have a shape that is recessed toward the display panel PN. In an embodiment, the first protection layer PL1 may form a step in the first groove GV1 and the second groove GV2. The second protection layer PL2 may form a step in the third groove GV3.

The first groove GV1, the second groove GV2, and the third groove GV3 may at least partially overlap an opening included in the support member MP. The first groove GV1 may overlap the first opening MP1-OP included in the first support member MP1. According to an embodiment, the first groove GV1 may overlap at least two or more first openings MP1-OP. The first groove GV1 may overlap a plurality of first openings MP1-OP included in the first support a member MP1. In an embodiment, a width (i.e., length in the first direction DR1) of the first groove GV1 may be greater than that of the first opening MP1-OP. The second groove GV2 may overlap the second opening MP2-OP included M the second support member MP2-OP. The second groove GV2 may overlap at least two or more second openings MP2-OP. The second groove GV2 may overlap a plurality of second openings MP2-OP included in the second support member MP2. The third groove GV3 may overlap the second opening MP2-OP included in the second support member MP2. The third groove GV3 may be formed to overlap at least two or more second openings MP2-OP. The third groove GV3, may overlap a plurality of second openings MP2-OP included in the second support member MP2. A width (i.e., length in the first direction DR1) of each of the second and third grooves GV2 and GV3 may be greater than that of the second opening MP2-OP. The width of the second groove GV2 and the third groove according to an embodiment may be substantially the same. However, embodiments of the present disclosure are not necessarily limited thereto.

A barrier layer BL may be positioned between the first protection layer PL1 and the first support member MP1 (e.g., in the third direction DR3). The barrier layer BL may be disposed under the first protection layer PL1. The barrier layer BL may be positioned under the display panel PN to support the display panel PN. In an embodiment, the barrier layer BL may be made of a polymer resin such as polyethylene terephthalate or polyimide.

In the display device according to an embodiment, the protection layers PL1 and PL2 positioned on the rear surface of the display panel PN may include grooves. When the display panel is bent, a stress applied to the protection layer and the display panel may be reduced by the grooves.

Referring to FIG. 4, the first protection layer PL1 may be positioned between the display panel PN and the support member MP. In addition, the second protection layer PL2 may be positioned between the display panel PN and the second support member MP2 or between the end of the display panel PN and the second adhesive layer P2.

The first protection layer PL1 and the second protection layer PL2 are disposed on the rear surface of the display panel PN to support the display panel PN and to protect the display panel PN from external impact. In an embodiment, the first protection layer PL1 and the second protection layer PL2 may each be formed of a polymer resin such as polyethylene terephthalate or polyimide.

The first protection layer PL1 and the second protection layer PL2 may be positioned on the rear surface of the display panel RN. The second protection layer PL2 may overlap an end of the third region R3. The second protection layer PL2 positioned at the end of the bent third region R3 may overlap the second support member MP2 and a portion of the first protection layer PL1.

The first protection layer PL1 may include a first groove GV1 overlapping the second region R2 and a second groove GV2 overlapping the third region R3. In addition, the second protection layer PL2 may include a third groove GV3 overlapping the third region R3.

Each of the first groove GV1, the second groove GV2, and the third groove GV3 may have various shapes and, for example, may have a shape that is recessed toward the display panel PN. The first protection layer PL1 may form a step in the first groove GV1 and the second groove GV2. The second protection layer PL2 may form a step in the third groove GV3.

The first groove GV1, the second groove GV2, and the third groove GV3 may at least partially overlap an opening included in the support member MP1. The first groove GV1 may overlap the first opening MP1-OP included in the first support member MP1. According to an embodiment, the first groove GV1 may overlap at least two or more first openings MP1-OP. The first groove GV1 may overlap a plurality of first openings MP1-OP included in the first support member MP1. A width of the first groove GV1 (i.e., length in the first direction DR1) may be greater than that of the first opening MP1-OP. The second groove GV2 may overlap the second opening MP2-OP included in the second support member MP2. The second groove GV2 may overlap at least two or more second openings MP2-OP. The second groove GV2 may overlap a plurality of second openings MP2-OP included in the second support member MP2. The third groove GV3 may overlap the second opening MP2-OP included in the second support member MP2. The third groove GV3 may be formed to overlap at least two or more second openings MP2-OP. The third groove GV3 may overlap a plurality of second openings MP2-OP included in the second support member MP2. A width of each of the second and third grooves GV2 and GV3 may be greater than that of the second opening MP2-OP. The width of the second groove GV2 and the third groove GV3 according to an embodiment may be substantially the same. However, embodiments of the present disclosure are not necessarily limited thereto.

The barrier layer BL according to an embodiment may include a first auxiliary layer S1 overlapping the first groove GV1. In an embodiment, the first auxiliary layer S1 may be integrally formed with the barrier layer BL. However, embodiments of the present disclosure are not necessarily limited thereto. The first auxiliary layer S1 according to an embodiment may have a shape that fills the first groove GV1. However, in embodiments of the present disclosure various other arrangements in which the first auxiliary layer S1 may be partially spaced apart from or completely coupled to the first groove GV1 may be utilized.

The second support member MP2 according to an embodiment may include a second auxiliary layer S2 overlapping the second groove GV2. In an embodiment, the second auxiliary layer S2 may be integrally formed with the second support member MP2. However, embodiments of the present disclosure are not necessarily limited thereto. The second auxiliary layer S2 according to an embodiment may have a shape filling the second groove GV2. However, in embodiments of the present disclosure various other arrangements in which the second auxiliary layer S2 is partially spaced apart from or completely coupled to the second groove GV2 may be utilized.

The second adhesive layer P2 according to an embodiment may include a third auxiliary layer S3 overlapping the third groove GV3. In an embodiment, the third auxiliary layer S3 may be integrally formed with the second adhesive layer P2. However, embodiments of the present disclosure are not necessarily limited thereto. The third auxiliary layer S3 according to an embodiment may have a shape filling the third groove GV3. However, in embodiments of the present disclosure, various other embodiments arrangements in which the third auxiliary layer S3 is partially spaced apart from or completely coupled to the third groove GV3 may be utilized.

Referring to FIG. 5 and FIG. 6, the first protection layer PL1 may be positioned between the display panel PN and the support member MP. In addition, the second protection layer PL2 may be positioned between the end of the display panel PN and the second support member MP2 or between the second adhesive layer P2 and the end of the display panel PN.

The first protection layer PL1 may include a first groove GV1 overlapping the second region R2, and a second groove GV2 overlapping the third region R3. In addition, the second protection layer PL2 may include a third groove GV3 overlapping the third region R3.

Each of the first groove GV1, the second groove GV2, and the third groove GV3 may have various shapes. For example, in an embodiment the first groove GV1 and the second groove GV2 may have a shape completely penetrating the first protection layer PL1. The third groove GV3 may have a shape that completely penetrates the second protection layer PL2. According to an embodiment, the first groove GV1 may overlap the first opening MP1-OP included in the first support member MP1. The first groove GV1 according to an embodiment may have substantially a same shape as that of the first opening MP1-OP. The second groove GV2 may overlap the second opening MP2-OP included in the second support member MP2. The second groove GV2 according to an embodiment may have substantially a same shape as that of the second opening MP2-OP. The third groove GV3 may overlap the second opening MP2-OP included in the second support member MP2. The third groove GV3 according to an embodiment may have substantially a same shape as that of the second opening MP2-OP.

In addition, each of the first to third grooves GV1 to GV3 may have a long rod shape extending longitudinally in the second direction DR2 in a plan view as illustrated in FIG. 6. A plurality of first grooves GV1 to third grooves GV3 may be positioned adjacent to each other in the first direction DR1 and the second direction DR2. In an embodiment, the first opening MP1-OP may have a same shape as that of the first groove GV1. The second opening MP2-OP may have a same shape as that of the second groove GV2 and the third groove GV3.

Figure 7:
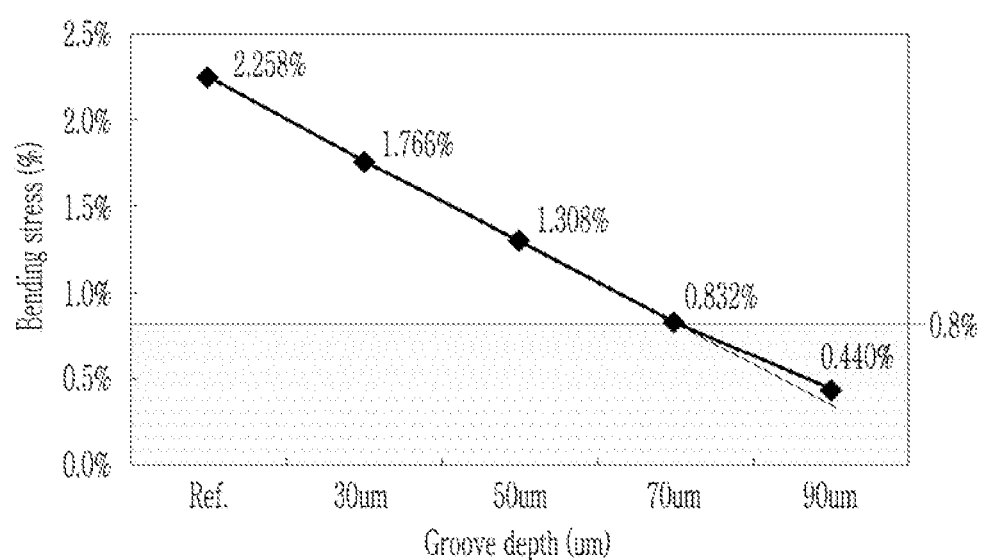
FIG. 7 illustrates a graph showing a change in compressive stress depending on a depth of a groove.

Hereinafter, an effect according to an embodiment will be described with reference to FIG. 7. FIG. 7 illustrates a graph showing a change in compressive stress depending on a depth of a groove.

As illustrated in FIG. 7, a bending stress depending on a change in depth of a groove included in a protection layer was confirmed. It was confirmed that in embodiments in which the depth of the groove increased from 30 μm to 90 μm, the bending stress decreased by about 1.766% to 0.440%. It was confirmed that the bending stress was reduced to a maximum of 20% or less compared to Ref without grooves.

In the display device according to an embodiment, the protection layers PL1 and PL2 positioned on the rear surface of the display panel PN may include grooves. When the display panel is bent, a stress applied to the protection layer and the display panel may be reduced by the grooves.

While the present disclosure has been described in connection with embodiments thereof, it is to be understood that the present disclosure is not limited to the disclosed embodiments but, on the contrary, is intended to cover various modifications and equivalent arrangements.

What is claimed is:

1. A display device comprising:
a display panel including first to third regions, the second region and the third region are respectively connected to opposite sides of the first region, the third region is bendable;
a flexible circuit board connected to an end of the third region;
a first protection layer overlapping the first region to third regions;
a second protection layer overlapping at least a portion of the third region; and
a support member overlapping the first protection layer, the support member including a plurality of openings,
wherein the first protection layer includes a first groove overlapping at least a portion of the second region and a second groove overlapping at least a portion of the third region, and
each of the first groove and the second groove overlaps the support member.

2. The display device of claim 1, wherein the second region of the display panel is a rollable or slidable region.

3. The display device of claim 1, wherein:
the third region includes a bending region; and
the third region is in a bent state so that at least a portion of the third region is positioned on a rear surface of the display panel.

4. The display device of claim 1, wherein the second protection layer includes at least one third groove.

5. The display device of claim 4, wherein the plurality of openings included in the support member includes a first opening overlapping at least portion of the first groove, and a second opening overlapping at least portion of the second groove.

6. The display device of claim 5, wherein the third groove overlaps at least a portion of the second opening.

7. The display device of claim 4, wherein a cross-section of each of the first to third grooves has a shape in which a width thereof becomes narrower in a direction towards the display panel.

8. The display device of claim 4, wherein a height of each of the first to third grooves is in a range of about 30 μm to about 90 μm.

9. The display device of claim 1, wherein:
the plurality of openings included in the support member include a plurality of first openings overlapping the second region and a plurality of second openings overlapping the third region;
the first groove overlaps at least two first openings; and
the second groove overlaps at least two second openings.

10. The display device of claim 9, wherein the second protection layer includes a third groove overlapping at least two second openings.

11. The display device of claim 10, wherein:
a width of the first groove is greater than a width of the plurality of first openings; and
widths of the second groove and the third groove are greater than a width of the plurality of second openings.

12. The display device of claim 10, further comprising:
a first auxiliary member overlapping the first groove;
a second auxiliary member overlapping the second groove; and
a third auxiliary member overlapping the third groove.

13. The display device of claim 12, further comprising:
a barrier layer positioned between the third region of the display panel and the support member, wherein the first auxiliary member is integrally formed with the barrier layer, and the second auxiliary member is integrally formed with the support member.

14. The display device of claim 12, further comprising:
an adhesive layer positioned between the support member and the second region of the display panel,
wherein the third auxiliary member is integrally formed with the adhesive layer.

15. A display device comprising:
a display panel including a display area and a non-display area;
a flexible circuit board connected to an end of the non-display area;
a first protection layer overlapping the display area and at least a portion of the non-display area;
a second protection layer overlapping at least a portion of the non-display area; and
a first support member and a second support member overlapping the first protection layer, the first and second support members including a plurality of openings,
wherein the first protection layer includes a first groove overlapping the first support member and a second groove overlapping the second support member.

16. The display device of claim 15, wherein:
the display area includes a first area and a second area overlapping the first support member; and
the non-display area includes a third area overlapping the second support member.

17. The display device of claim 16, wherein the second protection layer includes a third groove overlapping the third area.

18. The display device of claim 17, wherein a width of each of the first groove to the third groove decreases in a direction towards the display panel in a cross-sectional view.

19. The display device of claim 16, wherein:
the first support member includes a plurality of first openings,
the second support member includes a plurality of second openings,
the first groove overlaps at least one first opening, and
the second groove overlaps at least one second opening.

20. The display device of claim 19, wherein the first groove and the at least one first opening have a same shape in a plan view.

* * * * *